(12) United States Patent
Möehlmann

(10) Patent No.: US 10,187,069 B2
(45) Date of Patent: Jan. 22, 2019

(54) PHASE LOCKED LOOP WITH LOCK/UNLOCK DETECTOR

(71) Applicant: NXP B.V.

(72) Inventor: Ulrich Möehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 4 days.

(21) Appl. No.: 15/609,935

(22) Filed: May 31, 2017

(65) Prior Publication Data

US 2017/0366192 A1 Dec. 21, 2017

(30) Foreign Application Priority Data

Jun. 15, 2016 (EP) .................................. 16174626

(51) Int. Cl.
*H03L 7/06* (2006.01)
*H03L 7/095* (2006.01)
*H03L 7/091* (2006.01)
*H03L 7/099* (2006.01)

(52) U.S. Cl.
CPC .............. *H03L 7/095* (2013.01); *H03L 7/091* (2013.01); *H03L 7/0992* (2013.01); *H03L 2207/50* (2013.01)

(58) Field of Classification Search
USPC ................... 327/147–149, 156–158
See application file for complete search history.

(56) References Cited

U.S. PATENT DOCUMENTS

| | | | |
|---|---|---|---|
| 4,423,390 A | 12/1983 | Waters | |
| 7,397,881 B2* | 7/2008 | Yamazaki | ............ H03D 13/004 327/156 |
| 9,614,536 B2 | 4/2017 | Moehlmann | |
| 2005/0123087 A1 | 6/2005 | Yamazaki | |
| 2008/0231324 A1* | 9/2008 | Liu | ....................... H03D 13/004 327/12 |
| 2014/0354262 A1 | 12/2014 | Chen et al. | |

FOREIGN PATENT DOCUMENTS

| | | | |
|---|---|---|---|
| DE | 102009012440 A | 9/2010 | |
| EP | 1 885 067 A2 | 2/2008 | |

* cited by examiner

*Primary Examiner* — Adam Houston
(74) *Attorney, Agent, or Firm* — Rajeev Madnawat

(57) ABSTRACT

A phase locked loop is disclosed comprising: a phase detector, a loop filter, a frequency controller oscillator and a lock detector. The phase detector is operable in a bang-bang mode to provide a binary phase error signal indicating whether there is a positive or negative phase difference between a reference signal and a feedback signal. The loop filter is configured to provide a control signal derived from the binary phase error signal. The frequency controlled oscillator is configured to receive the control signal and provide an output signal with a frequency that varies according to the control signal. The lock/unlock detector is configured to determine a lock/unlock state of the phase locked loop, the lock/unlock state derived from a duty cycle and/or spectral content of the binary phase error signal.

15 Claims, 3 Drawing Sheets

PHASE LOCKED LOOP WITH LOCK/UNLOCK DETECTOR

CROSS-REFERENCE TO RELATED APPLICATIONS

This application claims the priority under 35 U.S.C. § 119 of European Patent application no. 16174626.8, filed on Jun. 15, 2016, the contents of which are incorporated by reference herein.

FIELD

The present disclosure relates to a method of detecting lock and/or unlock in a phase locked loop, and a phase locked loop comprising a lock/unlock detector.

BACKGROUND

Phase locked loops (or PLLs) are used to generate an output signal with a defined phase and frequency relationship to an input reference signal. The output signal is matched to the phase of the input reference signal by a feedback loop in which the phase difference between the input reference signal and the output signal is determined by a phase detector. In a digital phase locked loop, the phase detector outputs a digital signal. The output from the phase detector (indicating phase error) is received by a loop filter. The loop filter in turn provides an output signal to a frequency controlled oscillator. In an all-digital phase locked loop, the phase detector may output a digital signal, the loop filter may be a digital loop filter, and the frequency controlled oscillator may be a digitally controlled oscillator.

Phase locked loops may operate in a linear mode, in which the phase detector provides a signal that varies in a linear relationship with the phase error. A phase locked loop may also operate in a "bang-bang" mode, in which the phase detector provides a binary signal, indicating only that the phase error is positive or negative.

It is often desirable to know whether a PLL has achieved phase lock. For instance, in the context of a PLL being used to generate a local oscillator (LO) signal for a tuner, it is desirable to know if and when the PLL reaches a locked state after a tuning action. It is further desirable to know when the system is out of lock, for example, due to temperature drift or an unsuccessful tuning action.

SUMMARY

According to a first aspect, there is provided a phase locked loop comprising:
a phase detector, operable in a bang-bang mode to provide a binary phase error signal indicating whether there is a positive or negative phase difference between a reference signal and a feedback signal;
a loop filter configured to provide a control signal derived from the binary phase error signal;
a frequency controlled oscillator configured to receive the control signal and provide an output signal with a frequency that varies according to the control signal; and
a lock/unlock detector configured to determine a lock/unlock state of the phase locked loop, the lock/unlock state derived from a duty cycle and/or spectral content of the binary phase error signal.

The lock detector may comprise a high pass filter configured to receive the phase error signal, and to pass frequencies that correspond with a phase locked state of the phase locked loop.

The lock detector may comprise a rectifier for rectifying the output from the high pass filter to produce a rectified signal.

The lock detector may comprise a low pass filter arranged to receive a signal derived from the rectified signal.

The lock detector may comprise a programmable gain element arranged to receive the rectified signal, and to provide a modified rectified signal to the low pass filter.

The low pass filter and/or high pass filter may be configured such that a filter parameter of the low pass filter and/or the high pass filter can be varied using a control signal.

The low pass filter may be configured to be reset in response to a signal indicating an unlock condition.

The lock detector may comprise an input enable device, configured not to pass the binary phase error signal when a signal indicating an unlock condition is present.

The signal indicating an unlock condition may comprise at least one of: an indication that the phase locked loop is not in bang-bang mode, and an indication that the phase error signal has exceeded a predetermined threshold.

The lock detector may further comprise a comparator configured to compare an output signal from the low pass filter with at least one threshold value, and to output a signal, derived from the comparison, that indicates a criterion for phase lock is met (or that criteria are met).

The lock detector may comprise a timer, the timer configured to output a signal indicative of phase lock only when a signal, indicating a criterion for phase lock is met, has been in a predetermined state for a predetermined period.

The lock detector may comprise a latch that is set by the signal from the timer, and reset by a signal that indicates an unlock condition.

The lock detector may comprise an edge detector, configured to detect edges of the phase error signal.

The lock detector may comprise a low pass filter configured to receive a signal derived from the output of the edge detector.

According to a second aspect, there is provided a receiver comprising the phase locked loop of any preceding claim.

According to a third aspect, there is provided the lock detector of the first aspect.

According to a fourth aspect, there is provided a method of detecting phase lock in a phase locked loop operating in bang-bang mode, comprising determining at least one of duty cycle or a spectral content of a phase error signal.

Each feature of each aspect may be combined with the features of each other aspect, as appropriate. For instance, the lock detector of the fourth aspect may include any of the optional features of the lock detector described with respect to the first aspect.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
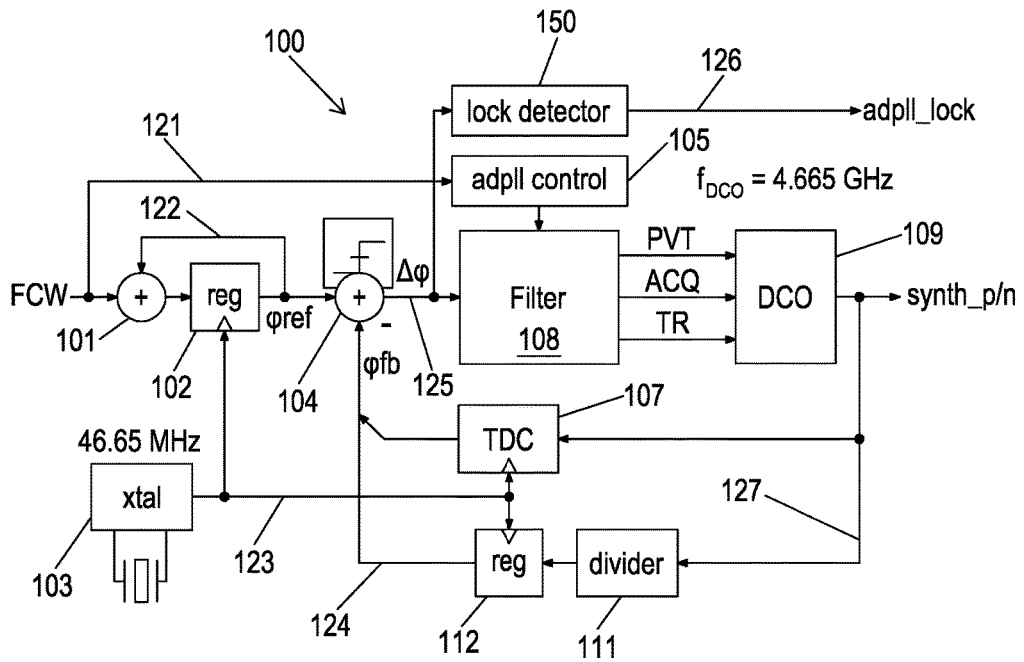
FIG. 1 is a block diagram of a phase locked loop according to an embodiment, comprising a lock detector.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

In some applications (such as tuners) it is important to know the quality of a local oscillator (LO) signal produced by a phase locked loop (PLL). For example, it may be important to understand if a phase locked loop reaches a lock state after a tuning action, or if the system is out of lock (e.g. due to unsuccessful tuning or a temperature drift). If a tuner comprises a phase locked loop that generates a local oscillator signal, it may be important to minimise the tuning time (i.e. the time for the local oscillator signal to lock onto a new desired frequency and/or phase).

In case of analogue reception like AM/FM the audio is typically muted during a tuning action or background scanning. If the muting interval gets too long it gets audible. Improved lock detection means that reception could start earlier and provide some additional time for background scanning of more channels or for data reception.

In the case of digital reception schemes such as DAB (digital audio broadcasting), a locked state of a PLL generating a LO signal may be determined by identifying that the phase error is below a threshold that is sufficient to avoid lost symbols and date re-synchronization.

FIG. 1 is a block diagram of an all-digital phase locked loop (ADPLL) 100. The phase locked loop 100 comprises: a reference phase generator 110, phase detector 104, loop filter 108, digitally controlled oscillator (DCO) 109, control block 105, lock detector 105, time to digital converter (TDC) 107, feedback divider 111, feedback register 112 and clock 103.

The clock 103 is an optional part of the ADPLL 100, and provides a reference frequency signal 123 (e.g. 46.65 MHz). In other embodiments the reference frequency 123 may simply be provided to the ADPLL 100 (e.g. by an external clock).

The reference phase generator 110 comprises an adder 101 and register 102, arranged to integrate an input frequency control word FCW, and thereby provide a reference phase ramp $\varphi_{ref}$.

A phase detector 104 compares the reference phase ramp $\varphi_{ref}$ with a feedback ramp $\varphi_{fb}$ derived from the output 127 of the DCO 109, and outputs a phase error signal $\Delta\varphi$. The feedback ramp $\varphi_v$ is determined by combining (e.g. by fixed point concatenation) the output from the feedback register 112 and the TDC 107. The phase detector 104 is operable in a "bang-bang" mode, in which the output phase error signal $\Delta\varphi$ is binary, either indicating a negative phase error or a positive phase error (e.g. −0.5 and +0.5 as normalised values respectively). The phase detector 104 may also be operable in a linear mode, in which the phase error signal $\Delta\varphi$ is proportional to the phase error.

The loop filter 108 receives the phase error signal $\Delta\varphi$, and performs a filtering operation. The loop filter 108 in this example is controlled by a control block 105, which may vary the configuration of the loop filter 108 (e.g. depending on the set FCW, and the loop state). The control block 105 may for example provide proportional gain $k_p$ and integral gain parameters $k_i$ to the loop filter 108 when in tracking mode.

The loop filter 108 provides three output signals for controlling the DCO 109, these being a process voltage temperature control signal PVT, an acquisition control signal ACQ, and a tracking signal TR. Each of these control signals may control a different switched capacitor bank of the DCO 109, so as to vary the output frequency of the DCO 109. In alternative arrangements a frequency controlled oscillator may be used comprising a digital to analog converter and a varactor.

The output from the DCO 109 is received by the feedback divider 111 and the TDC 107. The TDC 107 measures and quantizes the timing difference between transitions of the reference frequency 123 and the transitions of the ADPLL output signal 127. The feedback register 112 accumulates a count of the transitions in the frequency divided output of the ADPLL in each reference period. The output $\varphi_f$ from the TDC 107 is combined with the output $\varphi_i$ from the feedback register 112, for instance by concatenation.

As an illustrative example, the output from the DCO 109 may have a frequency of around 4.5 GHz (e.g. 4.665 GHz). The PVT capacitor bank of the DCO 109 may have a tuning resolution of around 10 MHz, the ACQ capacitor bank may have a tuning resolution of around 0.5 to 1 MHz, and the TR capacitor bank may have a tuning resolution on the order of 10 to 50 kHz. The TR mode may be able to handle a 1 MHz frequency offset.

When a new frequency control word FCW is input to the ADPLL 100, the control block 105 sequentially applies the correct loop filter parameters (e.g. $k_i$ and $k_p$) to the loop filter 108 so that first the PVT output, then the ACQ output, and finally the TR output can settle. The lock sequence starts with a PVT mode in which the loop filter 108 generates the PVT control signal, with the ACQ and TR control signals set to a neutral value (e.g. 0, where the ACQ and TR signals can be positive and negative).

When the PVT phase is accomplished, the PVT control signal is frozen, and the loop continues in ACQ mode. When the ACQ mode is accomplished, the ACQ word is frozen and the loop enters TR mode. In PVT and ACQ mode, the phase detector 104 may operate in a linear mode. When the loop enters TR mode, the phase detector 104 switches to a bang-bang mode of operation (as described above).

When the phase detector 104 is operating in bang-bang mode, the loop filter 108 may be configured (e.g. in response to a control signal from the control block 105) to change the TR output by a small and constant increment (positive or negative) for each clock cycle that there is a (positive or negative) phase error. A settling period (e.g. with some ringing) may occur when the loop filter 108 is switched to bang-bang mode. In bang-bang mode the ADPLL is not tuning between two states of the phase detector 104 (as in linear mode), but instead around a state (i.e. zero phase error). This means that the phase modulation is smaller than in linear mode, and hence the in-band phase noise performance is considerably better in bang-bang mode than in linear mode.

The phase locked loop 100 further comprises a lock detector 150, configured to determine when the ADPLL 100 is locked and unlocked.

Figure 2:
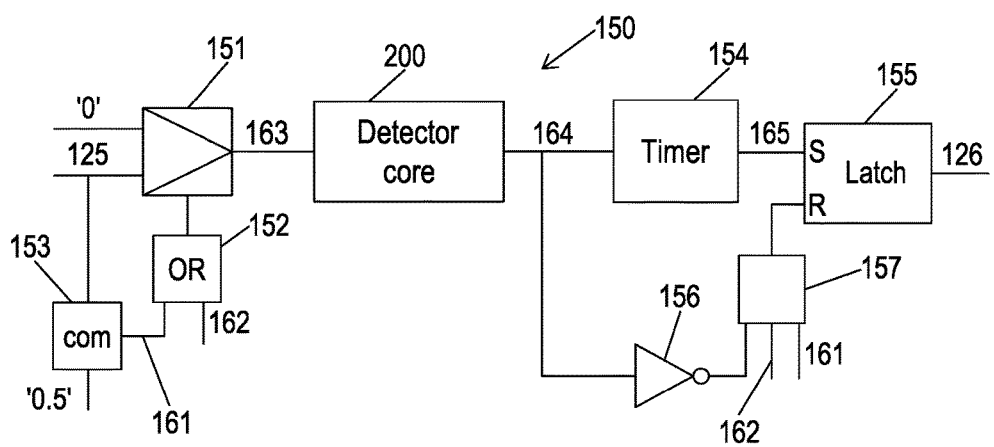
FIG. 2 is a block diagram of an example lock detector.

The lock detector 150 is shown in more detail in FIG. 2, and comprises: input enable switch 151, detector core 200, timer 154, latch 155, and logic and comparator blocks 153, 152, 156, 157.

The input enable switch 151 passes through the phase error 125 to the rest of the lock detector 150, unless the logic gate 152 indicates that the ADPLL is not in bang-bang mode, in which case a null signal '0' is provided. In the present example, the logic gate 152 receives a $\overline{\text{TR}}$ signal 162, which indicates (e.g. is high) when the ADPLL 100 is not in TR mode, and a |Δφ|>0.5 signal 161, which indicates (e.g. is high) when the magnitude of the phase error Δφ is greater than 0.5 (in units that correspond with the −0.5 and +0.5 binary bang-bang mode phase error outputs). In the present example, the logic gate 152 is an OR gate, but other arrangements are possible. The output from the logic gate 152 indicates when the ADPLL 100 is not in TR mode, and if the phase error Δφ is outside the bang-bang range of +/−0.5. The output signal 163 from the input enable switch 151 is therefore zero if the ADPLL is not in TR mode and if the phase error is outside +/−0.5.

The detector core 200 receives the output from the input enable switch 151 and determines whether the spectral characteristics and/or duty cycle of the phase error is indicative of phase lock. When the ADPLL is in phase lock in bang-bang mode, the phase error will comprise a high frequency signal with a duty cycle of approximately 50%. Either or both of these criteria may be detected by the detector core 200 to indicate phase lock in bang-bang mode.

Figure 3:
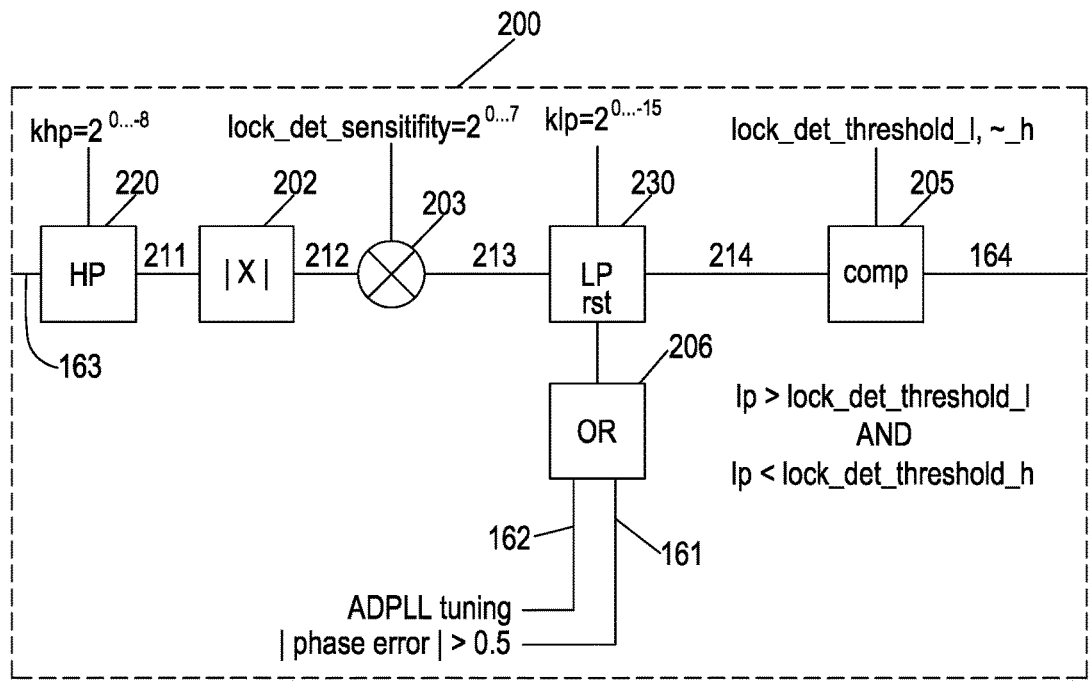
FIG. 3 is a block diagram of a detector core.

An example embodiment of a detector core 200 is shown in FIG. 3, in which both the spectral content and the duty cycle of the phase error is used to indicate phase lock. The detector core 200 comprises a high pass (HP) filter 220, rectifier 202, gain block 203, low pass (LP) filter 220 and comparator 205.

The HP filter 220 passes high frequency content (e.g. at the expected frequency with which the bang-bang phase error will switch between +/−0.5 in phase lock) and attenuates lower frequencies (associated with a settling phase).

Figure 4:
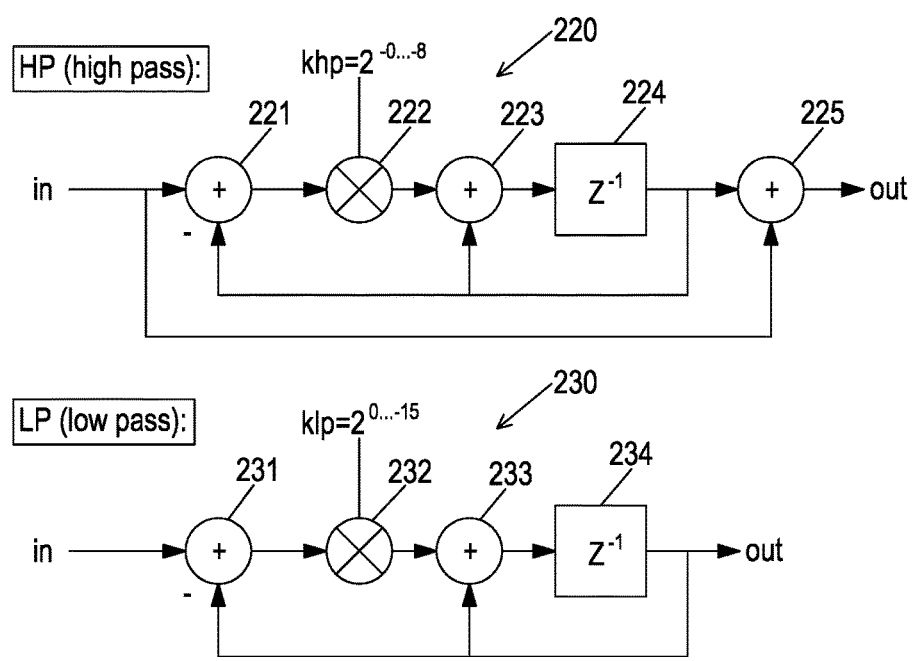
FIG. 4 is a block diagram of the high pass and low pass filter used in the detector core of FIG. 3.

An example of a suitable architecture for the HP filter 220 is shown in FIG. 4, and comprises a first summing block 221, gain block 222, second summing block 223, unit delay 224 and third summing block 225. The first summing block 221 subtracts the output of the unit delay 224 from the input signal 163. The gain block 222 receives the output from the first summing block 221, and multiplies this by a programmable gain factor khp, which may be equal to $2^{0 \cdots -8}$ (i.e. may be selectable in the range $2^0$ to $2^{-8}$). The second summing block 223 adds the output from the gain block 222 to the output of the unit delay 224. The unit delay operates on the output from the second summing block 223. The third summing block 225 subtracts the input signal 163 from the output of the unit delay block 224, to produce the edge signal 211. Other arrangements are possible for the HP filter 220.

Returning to FIG. 3, the rectifier 202 receives the HP filtered signal 211 from the HP filter 220, and rectifies it, and provides a rectified signal 212 to the programmable gain block 203. The gain block 203 multiplies the rectified signal 212 by a programmable lock sensitivity factor, lock_det_sensitivity (e.g. $2^{0 \cdots 7}$), to produce an input signal 213 for the low pass filter 230.

An example architecture for the LP filter 230 is shown in FIG. 4, comprising a first order infinite impulse response (IIR) filter. Any architecture that produces a low pass frequency response may be used, e.g. moving average, etc. The forward path of the low pass filter 230 of FIG. 4 comprises (in order) a first summing block 231, multiplier 232, second summing block 233 and unit delay 234. The output from the unit delay 234 is fed-back to the first summing block 231, where it is subtracted from the input signal to the filter 230, and to the second summing block 233, where it is added to the output of the multiplier 232. The multiplier 232 applies a gain factor (klp) to the output of the first summing block 233, and passes the result to the second summing block 233. The gain factor klp may be selectable in the range $2^0$ to $2^{-15}$.

Returning to FIG. 3, the low pass filter 230 may be reset in response to a reset signal (rst). In this example the reset signal rst is provided by logic gate 206. The inputs to logic gate 206 (which may be an OR gate) are the $\overline{\text{TR}}$ signal 162 and the |Δφ|>0.5 signal 161, as described already with reference to the input enable logic gate 152.

The LP filtered signal 214 from the LP filter 230 is provided to a comparator 205 that determines whether the LP filtered signal 214 has met a predetermined threshold condition (indicative of lock). In the present example, the comparator 205 provides an output signal that indicates when the filtered signal (lp) is within an envelope defined by a low threshold (lock_det_threshold_l) and a high threshold (lock_det_threshold_h), i.e.

lp>lock_det_threshold_l AND
lp<lock_det_threshold_h

In this example, when this condition is true the comparator output signal 164 indicates this (e.g. by going high). In other embodiments a single threshold may be used, and an output provided when this is exceeded. The present example has a low threshold of around 0.2, and a high threshold of around 0.4 (normalised values compared with 0.25 for a bang-bang ADPLL in which the phase error is varying between −0.5 and +0.5 with a duty cycle of 50%).

The output 164 from the detector core 200 is a signal that indicates that the spectral content and/or duty cycle of the phase error 125 meets a criterion (or criteria) indicative of phase lock in bang-bang mode.

Other arrangements and variations for the detector core 200 are possible. For example, the HP filter 201 may, in some embodiments, be replaced by an edge detector. In other embodiments, the detector core 200 may comprise counters that detect and count high and low events of the phase error 125. The count of high and low within an interval can be compared and if they are sufficiently similar, that may indicate phase lock. The count results may be filtered to avoid false detection of phase lock. One advantage of the embodiment of FIG. 3 is flexibility: it can be adjusted (e.g. by varying parameters) to suit a wide range of applications.

The timer 154 and latch 155 are optional features of the lock detector 150 that improve the reliability of lock indication, helping to prevent false indications of lock. The timer 154 is configured to provide an output that indicates whether the detector core 200 output signal 164 has indicated lock for a predetermined threshold period. The latch 155 is set by the timer output signal 165, and reset in response to: the detector core 200 criterion (or criteria) not being met (indicated by the output from the inverter 156); a $\overline{\text{TR}}$ signal 162; or a |Δφ|>0.5 signal 161.

The output 166 from the latch 156 is the lock detection signal, and reliably indicates whether lock has been achieved. Furthermore, it will may also rapidly indicate that when unlock occurs.

Figure 5:
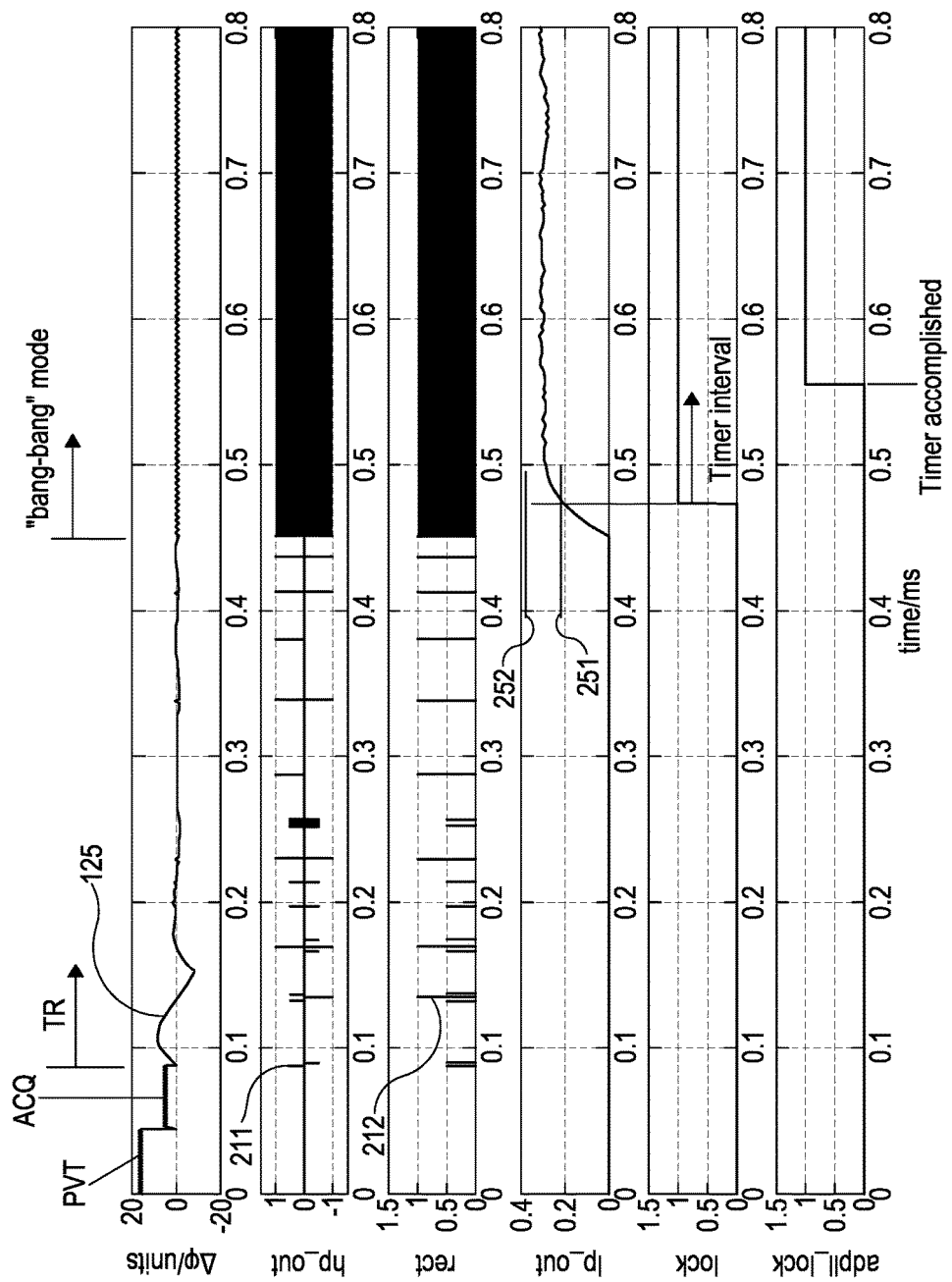
FIG. 5 is a set of graphs, illustrating the operation of a lock detector according to an embodiment.

FIG. 5 illustrates the operation of the example embodiment of FIGS. 1 to 4, showing a time history of: phase error 125, edge/zero crossing output 211, rectifier output signal 212, low pass filter output signal 214, comparator output signal 164 (indicating the lock criterion is met), and the latch output 166.

From t=0 ms to around t=0.09 ms, the ADPLL goes through PVT and ACQ mode, finally entering TR mode just before t=0.1 ms. During PVT and ACQ mode the input enable switch 151 prevents the lock detector 150 receiving any phase error signals, so there is no potential for a false lock indication during this period. When the ADPLL enters TR mode, there is some ringing of the loop filter 108 before it settles. During this ringing period, the amplitude of the phase error 125 is generally greater than 0.5, so the input enable switch 151 does not generally pass any signal to the detector core 200. The ringing of the loop filter 108 generates some non-zero output values from the high pass filter 201 (as it crosses zero), but these are of very short duration, and subsequently do not result in a significant change in the low pass filter output signal 214.

At around t=0.3, the phase error has largely settled to within the bang-bang limits of +/−0.5, but comprises largely low frequency spectral content, which does not result in a consistent response from the HP filter 201. When the ADPLL enters bang-bang mode, at around t=0.45 ms, the phase error starts to vary between −0.5 and +0.5 with a duty cycle of approximately 50%, at high frequency, and this phase error signal 125 is passed through the HP filter 201 and the rectifier 202. The LP filter 204 consequently receives a signal with a DC component, resulting in significant change in the LP filter output signal 214. At t~0.47 ms, the LP output signal 214 is within the envelope criteria of the comparator 205. The comparator output signal 164 consequently goes high, to indicate that the lock criteria are currently met. This high signal triggers the timer 154, which latches the lock detector output 126 after the output signal 126 has indicated that the lock criteria 251, 252 have been met for a predetermined period, at t~0.55 ms. The timer can be reset by logic 157 if conditions indicating unlock occur.

One application for a PLL according to the invention may be a communications device, such as a satellite or AM/FM radio receiver. A further application may be a radar chirp generator, e.g. for use in a vehicle proximity detector.

From reading the present disclosure, other variations and modifications will be apparent to the skilled person. Such variations and modifications may involve equivalent and other features which are already known in the art of phase locked loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A phase locked loop comprising:
a phase detector, operable in a bang-bang mode to provide a binary phase error signal indicating whether there is a positive or negative phase difference between a reference signal and a feedback signal;
a loop filter configured to provide a control signal derived from the binary phase error signal;
a frequency controlled oscillator configured to receive the control signal and provide an output signal with a frequency that varies according to the control signal; and
a lock/unlock detector configured to determine a lock/unlock state of the phase locked loop, the lock/unlock state derived from a duty cycle and/or spectral content of the binary phase error signal.

2. The phase locked loop of claim 1, wherein the unlock/lock detector comprises a high pass filter configured to receive the phase error signal, and to pass frequencies that correspond with a phase locked state of the phase locked loop.

3. The phase locked loop of claim 2, wherein the unlock/lock detector comprises a rectifier for rectifying the output from the high pass filter to produce a rectified signal.

4. The phase locked loop of claim 3, wherein the unlock/lock detector comprises a low pass filter arranged to receive a signal derived from the rectified signal.

5. The phase locked loop of claim 4, wherein the unlock/lock detector comprises a programmable gain element arranged to receive the rectified signal, and to provide a modified rectified signal to the low pass filter.

6. The phase locked loop of claim 4, wherein a filter parameter of the low pass filter and/or the high pass filter can be varied using a control signal.

7. The phase locked loop of claim 4, wherein the low pass filter is configured to be reset in response to a signal indicating an unlock condition.

8. The phase locked loop of claim 1, wherein the unlock/lock detector comprises an input enable device, configured not to pass the binary phase error signal when a signal indicating an unlock condition is present.

9. The phase locked loop of claim 7, wherein the signal indicating an unlock condition comprises at least one of: an indication that the phase locked loop is not in bang-bang mode, and an indication that the phase error signal has exceeded a predetermined threshold.

10. The phase locked loop of claim 4, wherein the unlock/lock detector further comprises a comparator configured to compare an output signal from the low pass filter with at least one threshold value, and to output a signal, derived from the comparison, that indicates at least one criterion for phase lock is met.

11. The phase locked loop of claim 1, wherein the unlock/lock detector comprises a timer, the timer configured to output a signal indicative of phase lock only when a signal, indicating at least one criterion for phase lock is met, has been in a predetermined state for a predetermined period.

12. The phase locked loop of claim 11, wherein the unlock/lock detector comprises a latch that is set by the signal from the timer, and reset by a signal that indicates an unlock condition.

13. The phase locked loop of claim 1, wherein the unlock/lock detector comprises an edge detector, configured to detect edges of the phase error signal.

14. The phase locked loop of claim 13, wherein the unlock/lock detector comprises a low pass filter configured to receive a signal derived from the output of the edge detector.

15. A receiver comprising the phase locked loop of claim 1.

* * * * *